(12) United States Patent
Watanabe et al.

(10) Patent No.: US 7,339,194 B2
(45) Date of Patent: Mar. 4, 2008

(54) SEMICONDUCTOR LASER DEVICE AND MANUFACTURING METHOD THEREOF

(75) Inventors: Yasuhiro Watanabe, Tottori (JP); Kouji Ueyama, Tottori (JP); Shinichirou Akiyoshi, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 0 days.

(21) Appl. No.: 10/575,899

(22) PCT Filed: Oct. 12, 2004

(86) PCT No.: PCT/JP2004/015010

§ 371 (c)(1), (2), (4) Date: Apr. 14, 2006

(87) PCT Pub. No.: WO2005/039000

PCT Pub. Date: Apr. 28, 2005

(65) Prior Publication Data

US 2007/0063212 A1    Mar. 22, 2007

(30) Foreign Application Priority Data

Oct. 15, 2003  (JP)  ............................. 2003-355479

(51) Int. Cl.
*H01L 27/15*  (2006.01)

(52) U.S. Cl. .................... 257/79; 257/684; 257/734

(58) Field of Classification Search .................. 257/79
See application file for complete search history.

(56) References Cited

U.S. PATENT DOCUMENTS 5,309,460 A    5/1994  Fujimaki et al.

6,885,076 B2    4/2005  Honda et al.

FOREIGN PATENT DOCUMENTS

| CN | 1443385 A   | 9/2003 |
| JP | 10-154848   | 6/1998 |
| JP | 11-307871   | 11/1999 |
| JP | 2000-164966 | 6/2000 |
| JP | 2001-53372  | 2/2001 |
| JP | 2002-43679  | 2/2002 |

OTHER PUBLICATIONS

International Search Report mailed Jan. 11, 2005.
Chinese Office Action issued in Chinese Patent Application No. CN 200480030350.7, mailed Jul. 20, 2007.

*Primary Examiner*—Long Pham
(74) *Attorney, Agent, or Firm*—McDermott Will & Emery LLP

(57) ABSTRACT

In a semiconductor laser device 10 including a semiconductor laser element 14, a frame 12 having a front face on which the semiconductor laser element 14 is placed, and a resin molded portion 15 that covers the front and back faces of the frame 12, on a front face side of the frame 12, the semiconductor laser element 14 is enclosed with an enclosure portion 15b of the resin molded portion 15, and the resin molded portion 15 has an open front serving as a laser beam emission window 15a. On a back face side of the frame 12, there is provided an exposed portion 16e enclosed with a U-shaped enclosure portion 15d of the resin molded portion 15, the exposed portion 16e where the frame 12 is exposed to the outside.

4 Claims, 8 Drawing Sheets

FIG.6 -- *PRIOR ART*
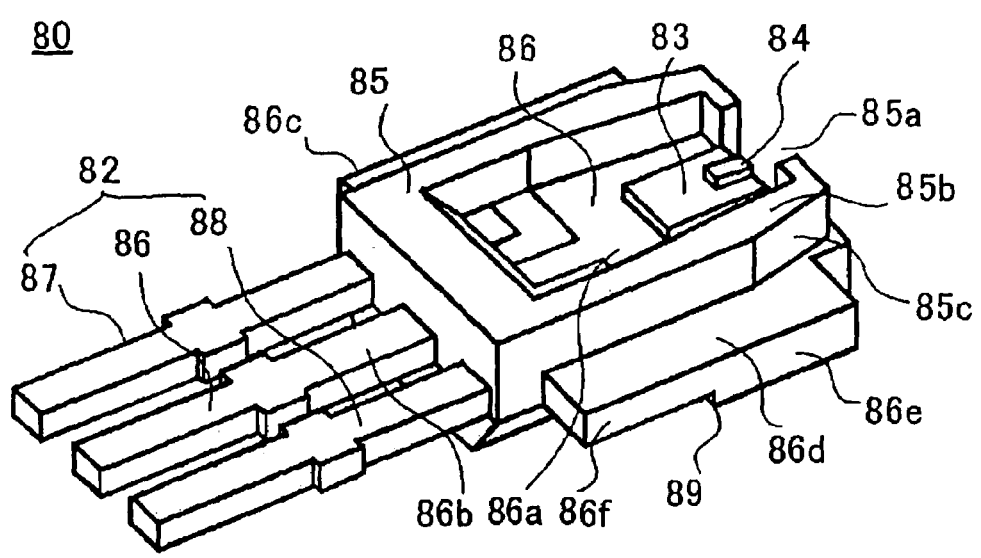

FIG.7 -- PRIOR ART
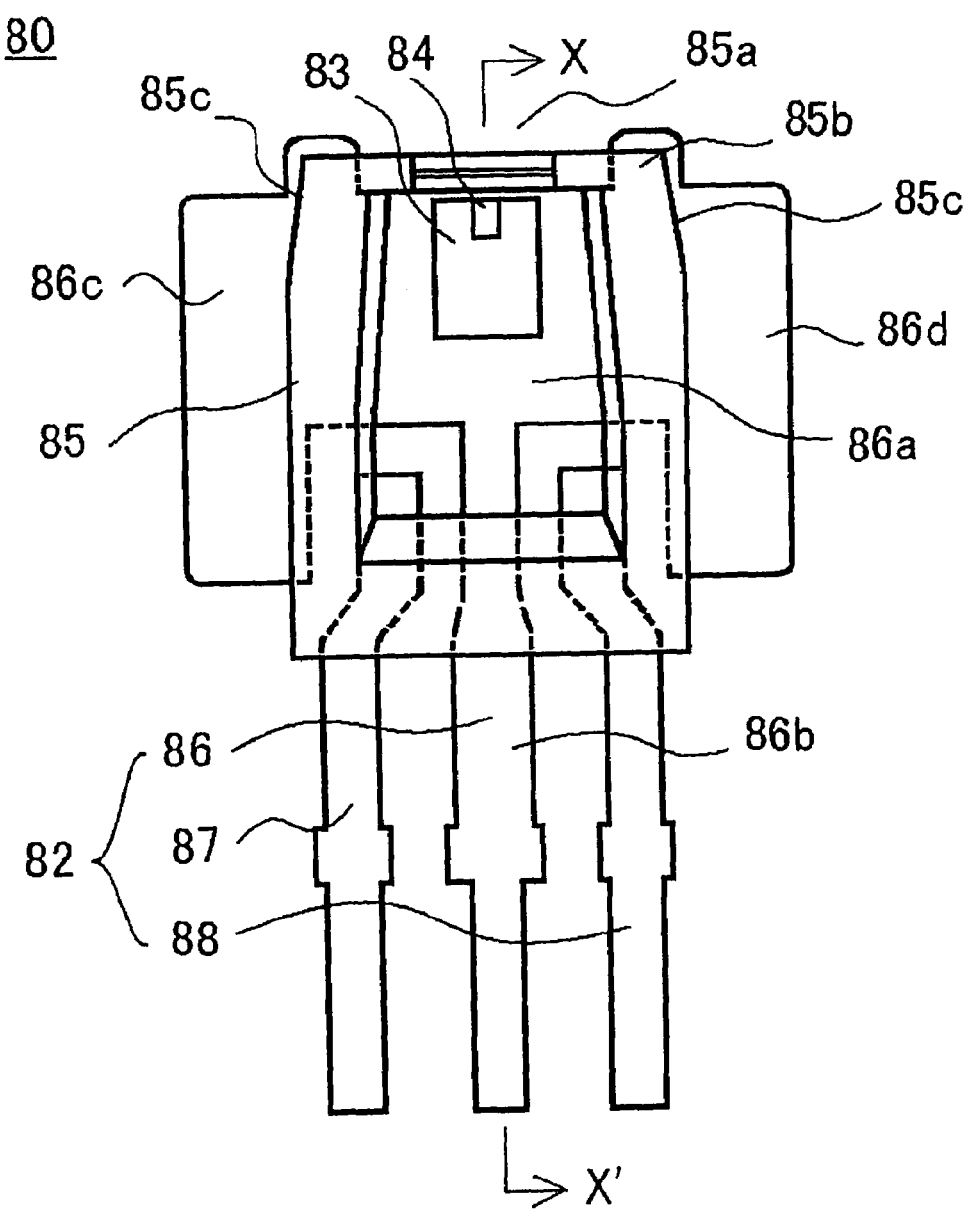

FIG.8 -- *PRIOR ART*
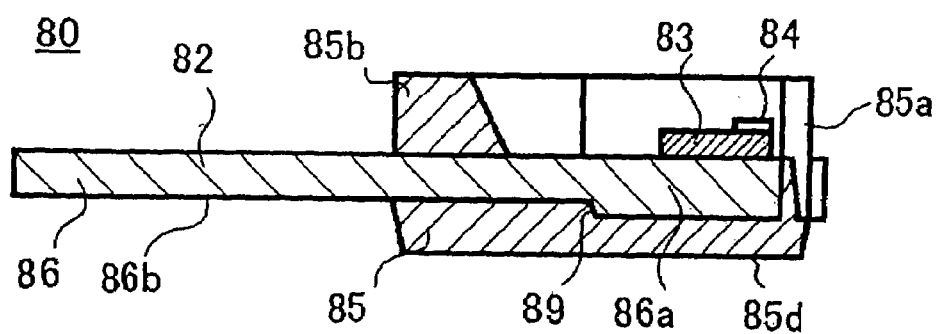

SEMICONDUCTOR LASER DEVICE AND MANUFACTURING METHOD THEREOF

This application is the U.S. National Phase under 35 U.S.C. § 371 of International Application No. PCT/JP2004/015010, filed Oct. 12, 2004, which in turn claims the benefit of Japanese Application No. 2003-355479, filed Oct. 15, 2003, the disclosures of which Applications are incorporated by reference herein in their entirety.

TECHNICAL FIELD

The present invention relates to a semiconductor laser device, and more particularly to a compact semiconductor laser device using a package composed of a frame and a resin member.

BACKGROUND ART

Compact discs (CDs), recordable compact discs (CD-Rs), rewritable compact discs (CD-RWs), digital versatile discs (DVDs) or recordable DVDs that offer higher density and the like are conventionally known as optical recording media. In an optical pickup for recording and playback these recording media, a compact semiconductor laser device is conventionally used as a light source.

There are two types of generally known semiconductor laser devices: a semiconductor laser device using a can package and a semiconductor laser device using a frame package. In the semiconductor laser device using a can package, leads are individually attached to a metal stem, and a laser element placed on the metal stem is sealed with a cap. In the semiconductor laser device using a frame package, a metal frame on which a semiconductor laser element is placed is formed by insert molding by using resin. The semiconductor laser device using a frame package can be mass-produced, and thus can be produced at lower cost. It is for this reason that the semiconductor laser device using a frame package has been receiving increasing attention.

However, the semiconductor laser devices using a frame package offer lower thermal dissipation than the widely-used semiconductor laser devices using a can package, and therefore often find application in infrared laser devices having stable temperature characteristics. Thus, further improvements have been sought therein so as to make them usable in high output power laser devices for CD-Rs or CD-RWs, red laser devices for DVDs or the like, dual wavelength laser devices, or blue laser devices that operate at high voltage.

A semiconductor laser device using a frame package that can solve the problem described above is disclosed in Patent Publication 1. This semiconductor laser device has a structure in which a portion of a frame on which a semiconductor laser element is placed is made thicker and is exposed on a bottom face thereof. However, in order to make the thick portion of the frame protrude through a resin member on the back face thereof in a manner as described above, it is necessary to reduce the thickness of the resin member disposed on the back face of the frame so as not to prevent protrusion of the thick portion of the frame. This makes it difficult to increase the frame fixing strength of the resin member.

Moreover, a considerable height difference has to be made in the thick portion so as to make the frame protrude through the resin member on the back face thereof, and the flatness of the back face of the semiconductor laser device is degraded due to the smallness of the area of the thick portion. This impairs the stability of the semiconductor laser device when it is handled or set. Furthermore, in a case where the semiconductor laser device using a frame package is used, for example, in an optical pickup, the bottom face of the frame package is seldom or never brought into contact with a body of the optical pickup. This makes it impossible to fully achieve the thermal dissipation effect of the semiconductor laser device.

On the other hand, a semiconductor laser device using a frame package that can improve the thermal dissipation characteristics and the strength as well as the flatness of the back face thereof is disclosed in Patent Publication 2. FIGS. 6 and 7 are a perspective view and a front view, respectively, of the semiconductor laser device. FIG. 8 is a sectional view taken along line X-X' of FIG. 7.

A semiconductor laser device 80 has a submount 83 placed and fixed on a top of a frame 82. A semiconductor laser element 84 is placed and fixed on a top of the submount 83. The frame 82 is formed of metal having high thermal conductivity and high electrical conductivity such as copper, iron, or an alloy thereof, and is in the form of a flat plate. The frame 82 is composed of a main frame 86 on which the semiconductor laser element 84 is to be mounted, and subframes 87 and 88 for wiring, each of which is independent of the main frame 86. The main frame 86 and the subframes 87 and 88 are integrated together with an insulating resin molded portion 85 into a frame package.

The main frame 86 includes an element placement portion 86a, a lead portion 86b, and wing portions 86c and 86d. The submount 83 is mounted on the element placement portion 86a. The lead portion 86b serves as a current path. The wing portions 86c and 86d are so formed as to protrude from opposite sides for thermal dissipation and positioning. The main frame 86 has a thick portion 86e and a thin portion 86f formed therein. The thick portion 86e is formed by increasing the thickness of a front part of the element placement portion 86a and front parts of the wing portions 86c and 86d, and the thin portion 86f is formed by reducing the thickness of rear parts of the wing portions 86c and 86d and the lead portion 86b.

Like the lead portion 86b, the subframes 87 and 88 are so formed as to be thin. This makes it possible to easily perform fine processing of the lead portion 86b and the subframes 87 and 88 when the frame 82 is formed by metal stamping. This makes it possible to make the semiconductor laser device 80 compact by keeping a space between the lead portion 86b and the subframes 87 and 88 as narrow as possible.

The resin molded portion 85 is formed by insert molding in such a way as to sandwich the front and back faces of the frame 82. The resin molded portion 85 has, on a front face thereof, a laser beam emission window 85a from which laser light is emitted, and a U-shaped enclosure portion 85b having an open front. The enclosure portion 85b has, at front edges of both side portions thereof, tapered faces 85c. The tapered faces 85c permit smooth insertion of the semiconductor laser device 80 when it is placed in a predetermined position. The resin molded portion 85 has, on a back face thereof, a solid flat face 85d that covers the element placement portion 86a and has substantially the same outer shape (a hexagonal shape) as the enclosure portion 85b on the front face.

The element placement portion 86a of the main frame 86 disposed inside the enclosure portion 85b and the subframes 87 and 88 have front faces exposed to the outside because the resin molded portion 85 is not formed thereon. The semiconductor laser element 84 is placed and fixed on the exposed element placement portion 86a with the submount 83 interposed therebetween. Then, the semiconductor laser element 84 and the main frame 86, and the submount 83 and the subframes 87 and 88 are connected together by a wire (not shown).

The submount 83 is built as a light receiving element whose base material is Si. This makes it possible to monitor light emerging from a rear face of the semiconductor laser element 84. Instead of Si, it is possible to use, for example, ceramic having high thermal conductivity such as AlN, SiC, or Cu, or metal material. Moreover, the submount 83 is fixed to the element placement portion 86a by using solder such as Pb—Sn, Au—Sn, or Sn—Bi, Ag paste, or the like. The semiconductor laser element 84 is fixed to a predetermined position of the submount 83 by using solder such as Au—Sn or Pb—Sn, Ag paste, or the like.

The semiconductor laser device 80 using a frame package structured as described above has the semiconductor laser device 84 having an open front face, thereby offering enhanced thermal dissipation characteristics. Moreover, since the back face of the frame 82 is not exposed on the resin molded portion 85, it is possible to thicken the resin molded portion 85. This increases the strength of the semiconductor laser device 80. Furthermore, the semiconductor laser device 80 has the bottom face with improved flatness and has a wide plane of support, whereby it can be set with high stability.

Patent Publication 1: JP-A-H11-307871
Patent Publication 2: JP-A-2002-43679 ([0010] to [0022], FIG. 1, FIG. 2, FIG. 4)

DISCLOSURE OF THE INVENTION

Problems to be Solved by the Invention

The semiconductor laser device 80 used in optical devices such as optical pickups has an optical element such as a diffraction grating fitted to the front of the semiconductor laser element 84. Such an optical element has to be fitted with high accuracy with respect to an optical axis of laser light. The reduction in size and cost of the optical pickups in recent years necessitates that the semiconductor laser device 80 has a reference for fitting such an optical element easily and accurately.

In general, a semiconductor laser device using a frame package is formed as follows. A thin flat plate of metal is stamped into a desired shape, thereby obtaining a frame 82 composed of a mount part (an element placement portion 86a) on which a semiconductor laser element is to be mounted and a lead part (a lead portion 86b and subframes 87 and 88). Then, insert molding is performed by using resin so as to support the mount part and the lead part, as well as to protect the semiconductor laser element 84. The semiconductor laser element 84 is fitted in such a way that laser light is emitted in the direction parallel to the frame 82.

In a case where the optical element is fitted with reference to the resin molded portion 85 of the semiconductor laser device 80, it is difficult to establish an accurate reference since the resin has poor temperature-related dimensional stability. On the other hand, in a case where the optical element is fitted with reference to the frame 82, it is difficult to establish an accurate reference since the frame 82 is formed of a thin flat plate.

According to the semiconductor laser device 80 disclosed in Patent Publication 2, the back face of the frame 82 is entirely covered with the resin molded portion 85. This necessitates that the optical element is fitted with reference to the resin molded portion 85, making it difficult to establish an accurate reference. This also makes the semiconductor laser device 80 relatively large.

In order to reduce the size of the semiconductor laser device 80, it is conceivable, for example, that a front part of the resin molded portion 85 is removed. In general, when the resin molded portion 85 is formed by insert molding, a gate portion that serves as an injection portion of the resin molded portion 85 is provided in the part of a back face of the element placement portion 86a corresponding to the submount 83.

However, when the front part of the resin molded portion 85 is removed, an injection gate of molding resin is provided above the lead portion 86b. In that case, since the lead portion 86b is in general not mechanically supported, it becomes distorted by the pressure exerted when resin is injected. This hampers automated wiring of bonding wires.

In view of the above-described problems of a semiconductor laser device using a frame package, it is an object of the present invention to provide a semiconductor laser device that offers good thermal dissipation and high setting stability, that can achieve reduction in size, and that can establish an accurate reference for fitting an optical element.

Means for Solving the Problem

To achieve the above object, the present invention is characterized in that, in a semiconductor laser device provided with: a semiconductor laser element; a frame having a front face on which the semiconductor laser element is placed; and a resin molded portion that covers the front and back faces of the frame, on a front face side of the frame, the semiconductor laser element is enclosed with the resin molded portion and the resin molded portion has an open front serving as a laser beam emission window, and, on a back face side of the frame, there is provided an exposed portion enclosed with the resin molded portion having an open front, the exposed portion where the frame is exposed to the outside.

The present invention is characterized in that, in the semiconductor laser device structured as described above, the resin molded portion provided on the back face side of the frame has parts thereof along both sides of the exposed portion formed in parallel to an optical axis of the semiconductor laser element.

The present invention is characterized in that, in the semiconductor laser device structured as described above, the resin molded portion provided on the back face of the frame is formed in the shape of the letter U.

The present invention is characterized in that, in the semiconductor laser device structured as described above, a front edge of the frame juts from the resin molded portion.

The present invention is characterized in that, in the semiconductor laser device structured as described above, the frame includes an element placement portion on which the semiconductor laser element is placed, a lead portion that is integrally formed with the element placement portion, the lead portion that serves as a current path with a wire connected thereto, and a tapered portion provided between the element placement portion and the lead portion, the tapered portion whose width is gradually reduced from the element placement portion toward the lead portion.

The present invention is characterized in that, in the semiconductor laser device structured as described above, the resin molded portion is formed by injecting molding resin from above the tapered portion.

The present invention is characterized in that, in the semiconductor laser device structured as described above, the frame includes an element placement portion on which the semiconductor laser element is placed and a lead portion that is integrally formed with the element placement portion, the lead portion that serves as a current path with a wire connected thereto, and the lead portion is made to have a width of 0.4 mm or more.

The present invention is characterized in that, in the semiconductor laser device structured as described above, the frame includes an element placement portion on which the semiconductor laser element is placed, a lead portion that is formed integrally with the element placement portion, the lead portion that serves as a current path with a wire connected thereto, and subframes that are arranged in parallel on both sides of the lead portion and are integrated with the lead portion by the resin molded portion, the subframes that serve as current paths with wires connected thereto, and the width of the lead portion is made greater than the width of each of the subframes.

The present invention is characterized in that, in the semiconductor laser device structured as described above, the resin molded portion is formed by injecting molding resin from above the lead portion.

ADVANTAGES OF THE INVENTION

According to the present invention, on a front face side of a frame, a semiconductor laser element is enclosed with a resin molded portion. This permits the semiconductor laser element to have an open top, thereby making it possible to achieve good thermal dissipation. Moreover, on a back face side of the frame, there is provided an exposed portion enclosed with the resin molded portion having an open front, the exposed portion where the frame is exposed to the outside. This makes it possible to make the semiconductor laser device compact, and use the exposed portion as an accurate reference for fitting an optical element.

According to the present invention, since the resin molded portion has parts thereof along both sides of the exposed portion formed in parallel to an optical axis of the semiconductor laser element, it is possible to easily fit the optical element in the resin molded portion with the optical element kept in contact with the exposed portion.

According to the present invention, since the resin molded portion provided on the back face side of the frame is formed in the shape of the letter U, it is possible to easily form the exposed portion that serves as a reference plane for fitting the optical element, and establish a more accurate reference by increasing the strength of the frame formed of a thin flat plate.

According to the present invention, since a front edge of the frame juts from the resin molded portion, it is possible to use the front edge of the frame as a front/rear reference for fitting the optical element.

According to the present invention, there is provided a tapered portion whose width is gradually reduced from an element placement portion toward a lead portion. This increases the strength between the element placement portion and the lead portion, making it possible to prevent the lead portion from being distorted by the pressure exerted when resin is injected even when it is injected from above the tapered portion.

According to the present invention, the lead portion is made to have a width of 0.4 mm or more. This increases the strength of the lead portion, making it possible to prevent the lead portion from being distorted by the pressure exerted when resin is injected even when it is injected from above the lead portion.

According to the present invention, the width of the lead portion is made greater than the width of each of the subframes arranged in parallel on both sides of the lead portion. This increases the strength of the lead portion, making it possible to prevent the lead portion from being distorted by the pressure exerted when resin is injected even when it is injected from above the lead portion.

BRIEF DESCRIPTION OF DRAWINGS

FIG. 6 A perspective view showing a conventional semiconductor laser device.

FIG. 7 A front view showing the conventional semiconductor laser device.

FIG. 8 A sectional view taken along line X-X' of FIG. 7.

Figure 1:
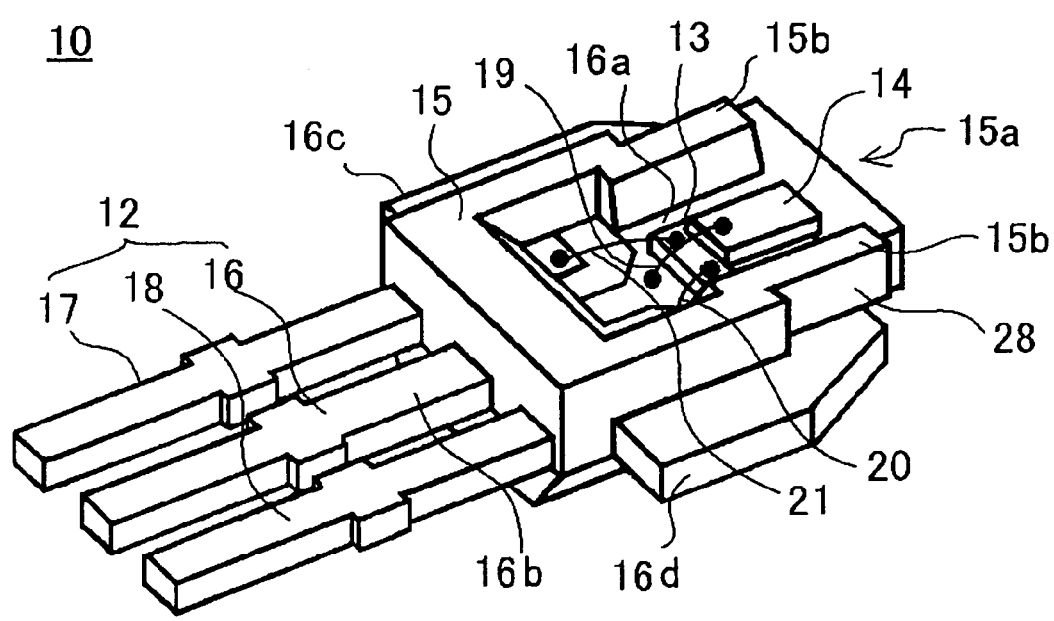
FIG. 1 A perspective view showing the semiconductor laser device of an embodiment of the present invention.

LIST OF REFERENCE SYMBOLS 10, 80 semiconductor laser device
12, 82 frame
13, 83 submount
14, 84 semiconductor laser element
15, 85 resin molded portion
15$b$, 15$d$, 85$b$ enclosure portion
16, 86 main frame
16$a$, 86$a$ element placement portion
16$b$, 86$b$ lead portion
16$e$ exposed portion
17, 18, 87, 88 subframe
19 to 21 wire
22 tapered portion
23 gate mark
25 optical element supporting member
26 optical element

BEST MODE FOR CARRYING OUT THE INVENTION

Hereinafter, an embodiment of the present invention will be described with reference to the accompanying drawings. It should be understood, however, that the embodiment presented below is simply intended to give an example of a semiconductor laser device that embodies the technical idea of the present invention, and therefore the semiconductor laser device specifically described below is not intended to limit in any way the manner in which to carry out the present invention. That is, the present invention finds wide application in the technical fields to which the appended claims are directed.

Figure 2:
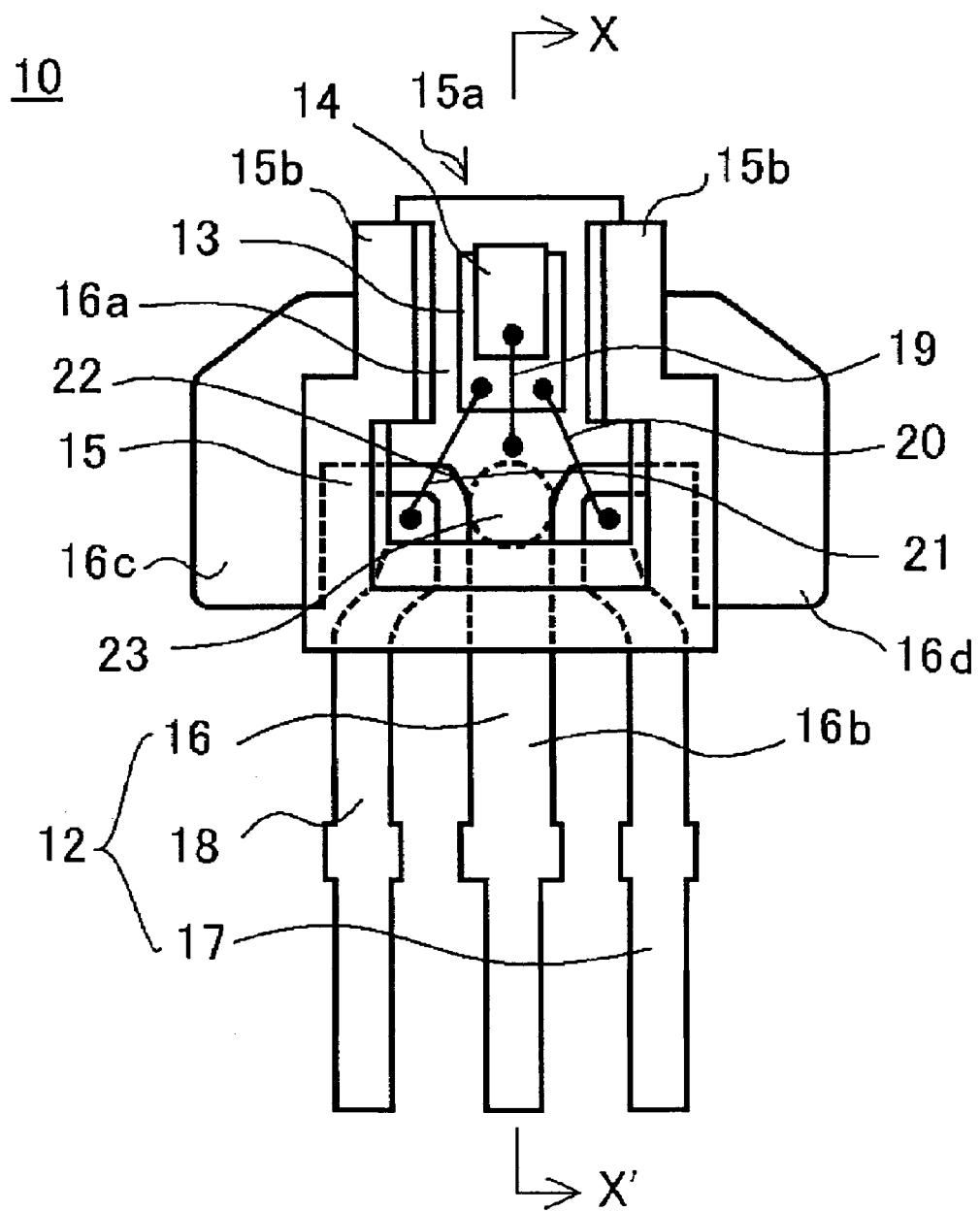
FIG. 2 A front view showing the semiconductor laser device of the embodiment of the present invention.
Figure 3:
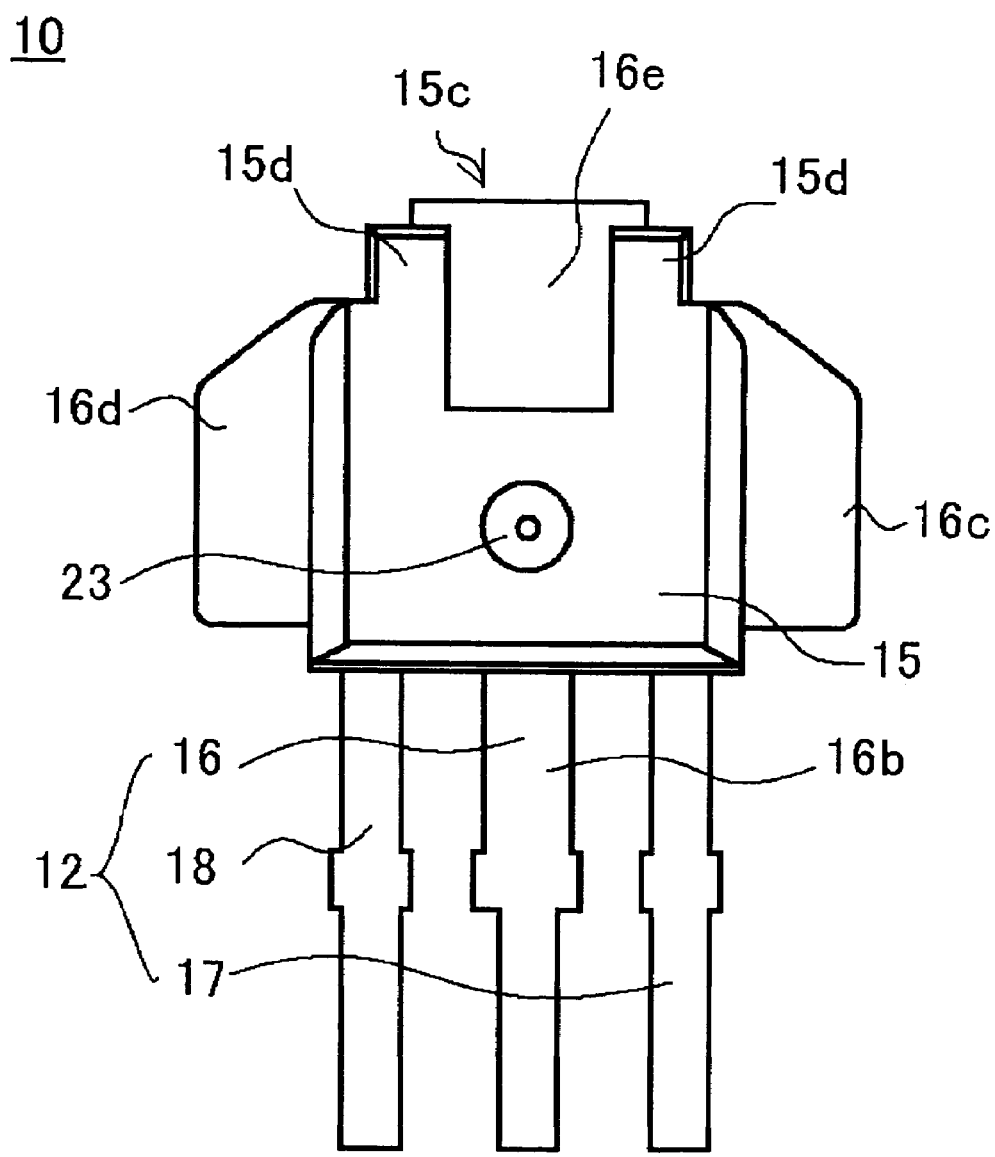
FIG. 3 A back view showing the semiconductor laser device of the embodiment of the present invention.
Figure 4:
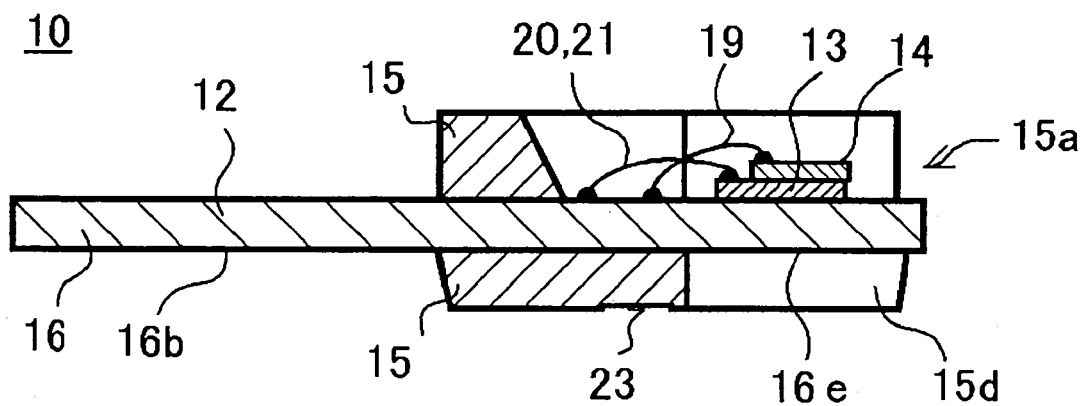
FIG. 4 A sectional view taken along line X-X' of FIG. 2.

FIGS. 1 to 3 are a perspective view, a front view, and a back view, respectively, of the semiconductor laser device of one embodiment. FIG. 4 is a sectional view taken along line X-X' of FIG. 2. The semiconductor laser device 10 has a submount 13 placed and fixed on a top of a frame 12. On a top of the submount 13, a semiconductor laser element 14 is placed and fixed.

The frame 12 is formed of metal having high thermal conductivity and high electrical conductivity such as copper, iron, or an alloy thereof, and is in the form of a thin flat plate. The frame 12 is composed of a main frame 16 on which the semiconductor laser element 14 is mounted, and subframes 17 and 18 for wiring, each of which is independent of the main frame 16. The main frame 16 and the subframes 17 and 18 are integrated together with an insulating resin molded portion 15 into a frame package.

The main frame 16 includes an element placement portion 16a, a lead portion 16b, and wing portions 16c and 16d. The submount 13 is mounted on the element placement portion 16a. The lead portion 16b serves as a current path. The wing portions 16c and 16d are so formed as to protrude from opposite sides for thermal dissipation and positioning.

Since the lead portion 16b and the subframes 17 and 18 are so formed as to be thin, it is possible to easily perform fine processing when the frame 12 is formed by metal stamping. This makes it possible to make the semiconductor laser device 10 compact by keeping a space between the lead portion 16b and the subframes 17 and 18 as narrow as possible.

The resin molded portion 15 is formed by, for example, insert molding in such a way as to sandwich the front and back faces of the frame 12. The resin molded portion 15 has, on a front face thereof, a laser beam emission window 15a from which laser light is emitted, and a U-shaped enclosure portion 15b having an open front. The width of a front part of the enclosure portion 15b is made smaller than that of a rear part thereof, and both side portions of the front part extend in parallel with the optical axis direction of the semiconductor laser element 14.

The resin molded portion 15 has, on a back face thereof, a U-shaped enclosure portion 15d which encloses an exposed portion 16e that is an exposed part of the back face of the main frame 16 corresponding to the submount 13. The enclosure portion 15d has, in a front part thereof, an open end 15c, and the width thereof on the open end 15c side is made smaller than that of a rear part thereof, and both side portions of the front part extend with parallel to the optical axis direction of the semiconductor laser element 14. This makes the back face of the resin molded portion 15 have substantially the same outer shape as the enclosure portion 15b on the front face thereof. Note that the resin molded portion 15 is formed in such a way that a front edge of the main frame 16 juts from the enclosure portions 15b and 15d.

The element placement portion 16a of the main frame 16 enclosed with the enclosure portion 15b and the subframes 17 and 18 have front faces exposed to the outside because the resin molded portion 15 is not formed thereon. The semiconductor laser element 14 is placed and fixed on the exposed element placement portion 16a with the submount 13 interposed therebetween. Then, the semiconductor laser element 14 and the lead portion 16b are connected together by a wire 19, and the submount 13 and the subframes 17 and 18 are connected together by wires 20 and 21.

The submount 13 is built as a light receiving element whose base material is Si. This makes it possible to monitor light emerging from a rear face of the semiconductor laser element 14. Instead of Si, it is possible to use, for example, ceramic having high thermal conductivity such as AlN, SiC, or Cu, or metal material. The submount 13 is fixed to the frame 12 by using solder such as Pb—Sn, Au—Sn, or Sn—Bi, Ag paste, or the like.

Used as the semiconductor laser element 14 is in general a one beam semiconductor laser element. In practice, however, it is possible to use a two beam semiconductor laser element. In that case, when the two beam semiconductor laser element includes an optical detector, it is necessary to use a four-terminal frame 12. On the other hand, when the two beam semiconductor laser element does not include an optical detector, it is possible to use a three-terminal frame 12. Note that the semiconductor laser element 14 is fixed to a predetermined position of the submount 13 by using solder such as Au—Sn or Pb—Sn, Ag paste, or the like.

In general, the semiconductor laser device using a frame package has, on a back face of the element placement portion 16a, an injection gate (not shown) of a molding resin injecting apparatus. Resin is injected through the injection gate in such a way that the back face of the element placement portion 16a is entirely resin molded. However, the semiconductor laser device 10 of the present embodiment does not have a resin member on the exposed portion 16e corresponding to the back face of the submount 13. Accordingly, the injection gate of the molding resin injecting apparatus is provided in a position above the lead portion 16b of the main frame 16.

Since the lead portion 16b is, in general, not mechanically supported, it becomes distorted by the pressure exerted when resin is injected. This hampers automated wiring of bonding wires. To address this problem, there is provided a tapered portion 22 whose width is gradually reduced from the element placement portion 16a of the main frame 16 toward the lead portion 16b. Moreover, the lead portion 16b is made to have a width of 0.4 mm or more, which is greater than the width of the subframes 17 and 18.

With this structure, the strength of the tapered portion 22 and the lead portion 16b is increased. This eliminates the possibility that the lead portion 16b is distorted or deformed even when it experiences the pressure exerted when resin is injected through the injection gate of the resin injecting apparatus provided above the tapered portion 22 or the lead portion 16b. Note that, by either providing the tapered portion 22 or by making the width of the lead portion 16b greater, it is possible to prevent the lead portion 16b from being distorted or deformed.

Moreover, the semiconductor laser device 10 of the present embodiment manufactured in a manner as described above has a so-called gate mark 23 corresponding to the injection gate, which is a mark left in a part of the resin molded portion 15 corresponding to the tapered portion 22 or the lead portion 16b. This helps distinguish it from the conventional semiconductor laser device.

When the width of the lead portion 16b is 0.4 mm or less, the strength thereof is reduced, and therefore there is a possibility that the frame 12 is distorted by the pressure exerted when resin is injected. This is undesirable because this hampers wiring of the semiconductor laser element 14. The upper limit of the width of the lead portion 16b may be appropriately set by a person skilled in the art according to the size of a needed semiconductor laser device. In the case of the compact semiconductor laser device 10 of the present embodiment, the lead portion 16b having a width of about 1 mm or less is used.

Figure 5:
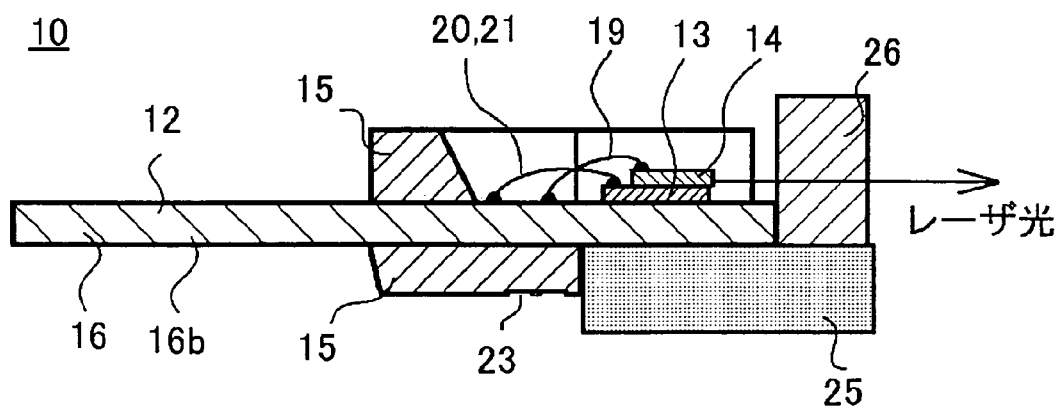
FIG. 5 A sectional view showing a state in which the optical member is fitted to the semiconductor laser device of the embodiment of the present invention.

FIG. 5 is a side sectional view showing a state in which an optical element is fitted to the semiconductor laser device 10 of the present embodiment. An optical element 26 is fitted to the semiconductor laser device 10 in the following manner. First, an optical element supporting member 25 having the shape of an elongate rectangular parallelepiped is fixed to the semiconductor laser device 10. The optical element supporting member 25 is positioned in such a way that it comes into contact with the exposed portion 16e provided on the back face of the main frame 16 corresponding to the submount 13 and with inner edges of both side portions of the open end 15c of the back-face enclosure portion 15d.

Then, a desired optical element 26 is placed on a top of the optical element supporting member 25 in such a way as to make contact with the front edge of the main frame 16 jutting from the resin molded portion 15. This makes it possible to make an optical axis of the optical element 26 aligned with an optical axis of the laser light only by moving the optical element 26 from side to side with the optical element 26 kept in contact with the front edge of the main frame 16.

According to the present embodiment, the enclosure portion 15d on the back face of the resin molded portion 15 is formed into a U-shape, with the open end 15c formed in the front part thereof and the both side portions in the front part thereof extending in parallel with the optical axis direction of the semiconductor laser element 14. With this structure, the optical element supporting member 25 makes contact with the inner edges on the open end 15c side of the enclosure portion 15d, permitting it to be positioned in the front/rear direction and the right/left direction. Moreover, the optical element supporting member 25 makes contact with the exposed portion 16e on the back face of the main frame 16, permitting it to be positioned in the up/down direction (a direction perpendicular to the front face of the frame 12).

The optical element 26 placed on the optical element supporting member 25 is positioned in the up/down direction by making contact with the optical element supporting member 25, and is positioned in the front/rear direction by making contact with the front edge of the main frame 16 jutting from the resin molded portion 15. Then, the optical element 26 is moved from side to side on the optical element supporting member 25 along the main frame 16 for positioning, and eventually it is placed on the optical axis of the laser light.

This permits the optical element 26 to be fitted in the up/down direction and the front/rear direction with respect to the frame 12 with good flatness. Moreover, the U-shaped back-face enclosure portion 15d permits the both side portions on the back face of the frame 12 to be covered with the resin molded portion 15 up to the front parts thereof. This makes it possible to increase the strength of the frame 12 formed of a thin flat plate and establish an accurate reference. As a result, it is possible to position the optical element 26 with high accuracy. Note that, since it is only necessary to roughly position the optical element supporting member 25 in the front/rear direction and the right/left direction, no problem arises even if the resin molded portion 15 having poor temperature-related dimensional stability is used as a reference.

Moreover, by providing the exposed portion 16e, it is possible to make the resin molded portion 15 compact, thereby achieving a reduction in size of the semiconductor laser device 10. Furthermore, since the optical element supporting member 25 fits in the enclosure portion 15d and makes contact with the exposed portion 16e, it is possible to make compact the semiconductor laser device 10 with the optical element 25 fitted thereto, and thus make compact the optical devices such as optical pickups.

INDUSTRIAL APPLICABILITY

The present invention can find application in a semiconductor laser device using a frame package to be mounted on optical devices such as optical pickups.

The invention claimed is:

1. A semiconductor laser device comprising:
a semiconductor laser element;
a frame having a front face on which the semiconductor laser element is placed; and
a resin molded portion that covers the front and back faces of the frame,
wherein, on a front face side of the frame,
the semiconductor laser element is enclosed with the resin molded portion, and
the resin molded portion has an open front serving as a laser beam emission window,
wherein, on a back face side of the frame, there is provided an exposed portion enclosed with the resin molded portion having an open front, the exposed portion where the frame is exposed to an outside, and
wherein the frame includes
an element placement portion on which the semiconductor laser element is placed,
a lead portion that is integrally formed with the element placement portion, the lead portion that serves as a current path with a wire connected thereto, and
a tapered portion provided between the element placement portion and the lead portion, the tapered portion whose width is gradually reduced from the element placement portion toward the lead portion.

2. The semiconductor laser device of claim 1, further comprising:
a gate mark of an injection gate through which molding resin is injected, the gate mark provided above the tapered portion.

3. A semiconductor laser device comprising:
a semiconductor laser element;
a frame having a front face on which the semiconductor laser element is placed; and
a resin molded portion that covers the front and back faces of the frame,
wherein, on a front face side of the frame,
the semiconductor laser element is enclosed with the resin molded portion, and
the resin molded portion has an open front serving as a laser beam emission window,
wherein, on a back face side of the frame, there is provided an exposed portion enclosed with the resin molded portion having an open front, the exposed portion where the frame is exposed to an outside, and
wherein the frame includes
an element placement portion on which the semiconductor laser element is placed, and
a lead portion having a width of 0.4 mm or more that is integrally formed with the element placement portion, the lead portion that serves as a current path with a wire connected thereto.

4. A semiconductor laser device comprising:
a semiconductor laser element;
a frame having a front face on which the semiconductor laser element is placed; and
a resin molded portion that covers the front and back faces of the frame,
wherein, on a front face side of the frame,
the semiconductor laser element is enclosed with the resin molded portion, and
the resin molded portion has an open front serving as a laser beam emission window,
wherein, on a back face side of the frame, there is provided an exposed portion enclosed with the resin molded portion having an open front, the exposed portion where the frame is exposed to an outside,
wherein the frame includes
an element placement portion on which the semiconductor laser element is placed,
a lead portion that is formed integrally with the element placement portion, the lead portion that serves as a current path with a wire connected thereto, and
subframes that are arranged in parallel on both sides of the lead portion and are integrated with the lead portion by the resin molded portion, the subframes that serve as current paths with wires connected thereto, and
wherein a width of the lead portion is made greater than a width of each of the subframes.

* * * * *